United States Patent [19]

Norwood et al.

[11] Patent Number: 4,876,671

[45] Date of Patent: Oct. 24, 1989

[54] SEMICONDUCTOR DYNAMIC MEMORY DEVICE WITH METAL-LEVEL SELECTION OF PAGE MODE OR NIBBLE MODE

[75] Inventors: Roger D. Norwood, Sugar Land; Jino Chun, Houston; Pravin P. Patel, Sugar Land, all of Tex.

[73] Assignee: Texas Instruments Incorporated, Dallas, Tex.

[21] Appl. No.: 336,637

[22] Filed: Apr. 6, 1989

Related U.S. Application Data

[63] Continuation of Ser. No. 232,543, Aug. 11, 1988, abandoned, which is a continuation of Ser. No. 122,508, Nov. 17, 1987, abandoned, which is a continuation of Ser. No. 728,740, Apr. 30, 1985, abandoned.

[51] Int. Cl.$^4$ .......................... G11C 8/00; G11C 7/00
[52] U.S. Cl. .................... 365/233; 365/238.5; 365/230.09; 365/189.11; 365/193
[58] Field of Search ........... 365/238.5, 230.09, 230.01, 365/230.04, 189.11, 189.08, 189.03, 233, 193

[56] References Cited

U.S. PATENT DOCUMENTS

| | | | |
|---|---|---|---|
| 4,422,160 | 12/1983 | Watanabe | 365/235 |
| 4,510,602 | 4/1985 | Engdahl et al. | 365/189 |
| 4,575,825 | 3/1986 | Ozaki et al. | 365/193 |
| 4,586,167 | 4/1986 | Fujishima et al. | 365/193 |
| 4,618,946 | 10/1986 | Little et al. | 365/238 |
| 4,618,947 | 10/1986 | Tran et al. | 365/189 |

Primary Examiner—Stuart N. Hecker
Assistant Examiner—Melissa J. Koval
Attorney, Agent, or Firm—Ferdinand M. Romano; Thomas W. DeMond; Melvin Sharp

[57] ABSTRACT

A semiconductor dynamic memory device is disclosed which contains circuitry for implementing both page mode and nibble modes using a conductor level selection. A clock voltage used in column decoding and output is either coupled to or decoupled from the column strobe or CAS input by conductor, so this clock voltage is rendered either dependent on, or independent of, the cycling of the column strobe.

29 Claims, 4 Drawing Sheets

SEMICONDUCTOR DYNAMIC MEMORY DEVICE WITH METAL-LEVEL SELECTION OF PAGE MODE OR NIBBLE MODE

This application is a continuation of application Ser. No. 232,543 now abandoned, filed Aug. 11, 1988 which is a continuation of application Ser. No. 122,508 now abandoned filed Nov. 17, 1987 which is a continuation of application Ser. No. 728,740 now abandoned filed Apr. 30, 1985.

BACKGROUND OF THE INVENTION

This invention relates to semiconductor memory devices and more particularly to an improved high-density MOS random access, dynamic read/write memory.

The most widely used semiconductor memory device for computers is the MOS dynamic RAM, such as the 64K-bit device illustrated in U.S. Pat. No. 4,239,993, issued to McAlexander, White and Rao, assigned to Texas Instruments. These devices have traditionally included a "page mode" of operation in which the row address strobe $\overline{RAS}$ is held low while the column address strobe $\overline{CAS}$ is toggled, producing faster data output for data located in the same page (same row address but different column address). Now devices are being manufactured having a "nibble mode" of operation in which the $\overline{RAS}$ and $\overline{CAS}$ sequence is the same as page mode, but, instead of latching in a new column address each time $\overline{CAS}$ is toggled, the original column address is used and incremented by 1. Nibble mode is faster, but limited in address range. From a manufacturer's standpoint, production of both page mode and nibble mode devices requires processing two different types of slices, which adds to the cost of both. It is of course preferable to produce a very large quantity of one design, rather than a number of different designs.

Dynamic RAM chips providing either page mode or nibble mode have been described by Shimotori et al, ISSCC Digest of Technical Papers, p. 228, Feb. 1983, but the the selection is made by using different timing inputs, which placed a burden on the system designer.

It is the principal object of this invention to provide improved dynamic random access memory devices, particularly for providing either page mode or nibble mode. Another object is to provide selection between page mode and nibble mode for semiconductor dynamic memory devices which use a low cost manufacturing method, and/or which do not restrict the system designer.

SUMMARY OF THE INVENTION

In accordance with one embodiment of the invention, a semiconductor dynamic memory device uses a metal-level option to give the advantages of high volume and yield in manufacture, as well as insuring equivalent device quality and reliability. Processing of the slices containing the two different parts is identical, except for the different metal-level masks used in the last steps of the process.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
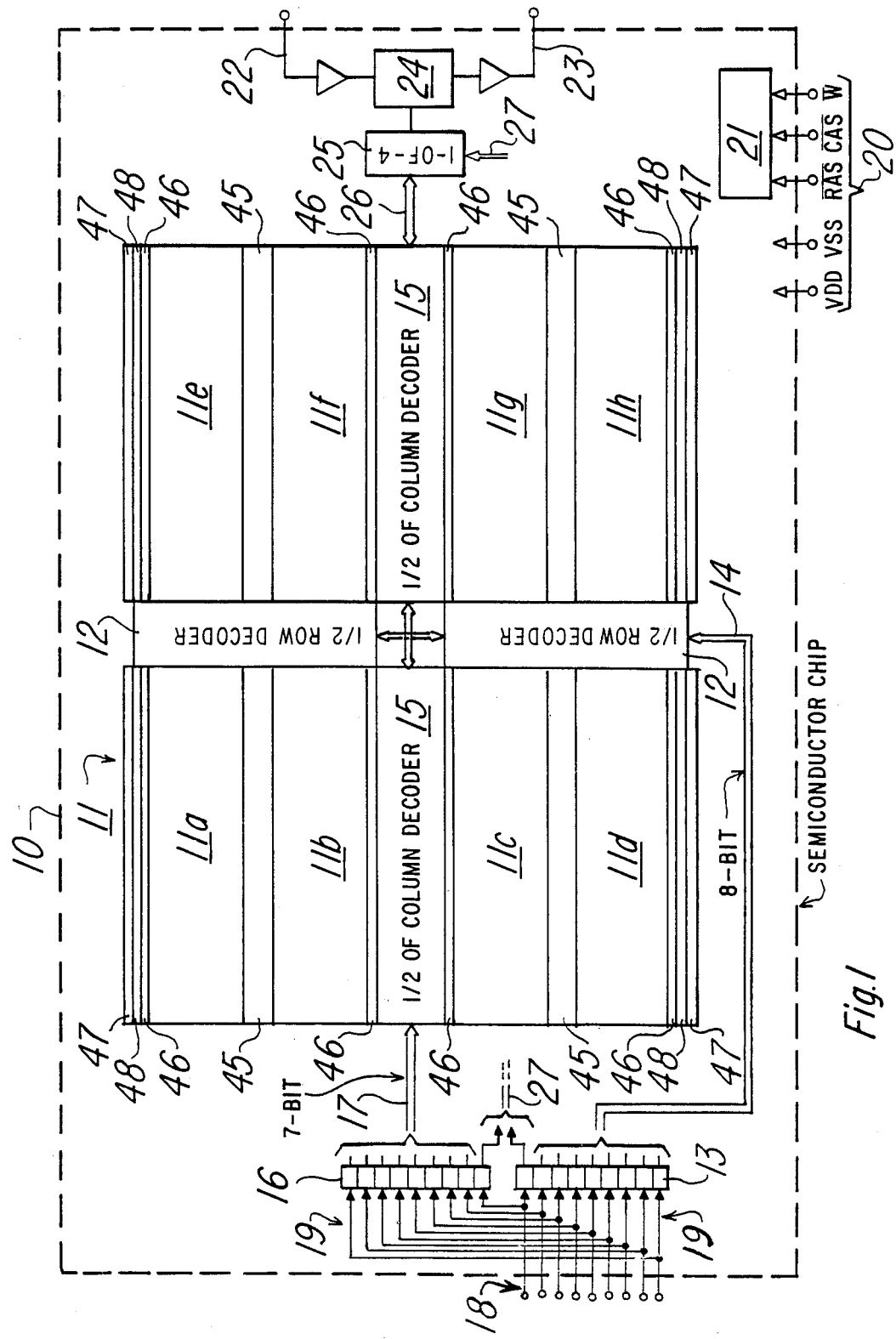
FIG. 1 is an electrical schematic diagram in block form of a semiconductor memory device employing features of the invention.

With reference to FIG. 1, one example of a semiconductor memory device that employs the selector circuit of the invention is illustrated. The device is formed in a silicon chip 10 containing an array 11 of dynamic one-transistor memory cells. In this embodiment, the array contains "256K" or 262,144 cells, which if not partitioned would be a square array of 512×512 cells; the array is broken into eight arrays 11a–11h, however, with each of these containing 256 columns (256 pairs of bit lines) with sixty-four cells per bit line, or 2×256×64=32,768 cells. A row decoder 12 positioned between the arrays selects 4-of-1024 rows based upon an 8-bit row address received from a set of row address buffers 13 by lines 14. A 4-of-512 column select is performed by a Y decoder 15 which receives a seven bit column address from seven column buffers 16 via lines 17. A set of nine address input terminals 18 is connected to the row and column buffers 13 and 16 by lines 19. The address is multiplexed; the row address is gated into the buffers 13 when a row address strobe signal $\overline{RAS}$ drops to zero, and the column address is gated into the buffers 16 when a column address strobe signal $\overline{CAS}$ drops to zero (for a 1-bit read or write). The $\overline{RAS}$ and $\overline{CAS}$ signals are applied to the chip by terminals 20 along with a read/write control $\overline{W}$, all these signals being connected to a clock generator 21 which produces all of the internal clocks. A supply voltage Vdd, usually +5 v, and ground Vss are also applied to the chip 10 by external terminals 20. A single-bit data input terminal 22 and a single-bit data output terminal 23 are connected to an I/O buffer and control circuit 24. A one-of-four column selector 25 connects one of the four sets of I/O lines 26 coming from the column decoder to the I/O control 24. This selector 25 receives two column address bits from the buffers 16 by lines 27. The semiconductor chip 10 is mounted in a sixteen-pin package of the standard type.

Figure 2A:
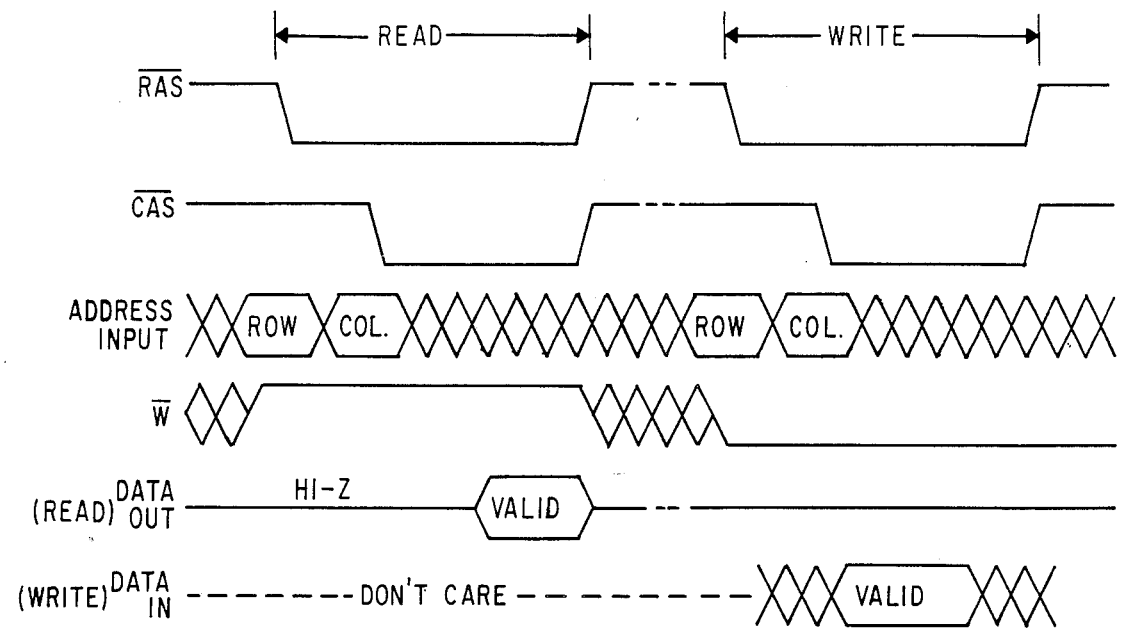
FIGS. 2a-2c are timing diagrams for the device of FIG. 1.
Figure 2B:
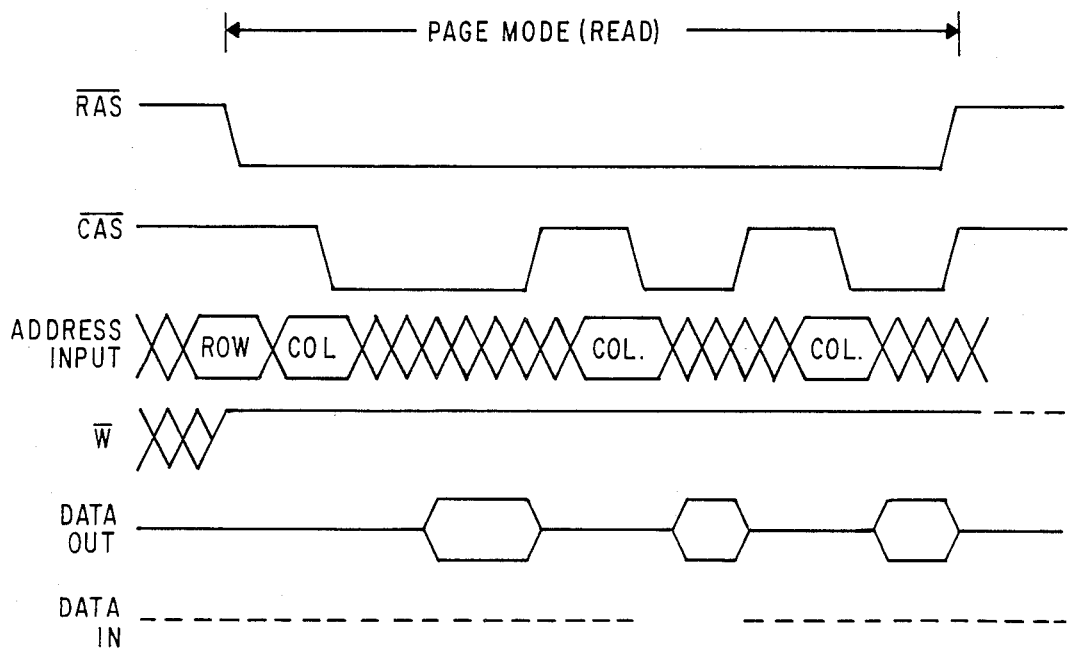
Figure 2C:
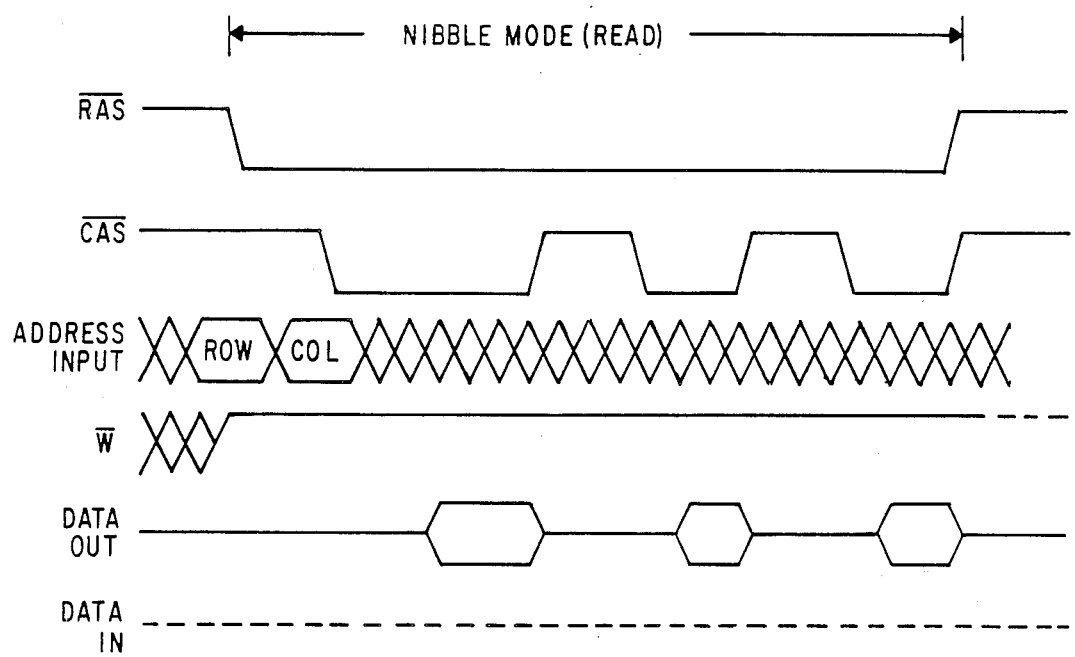

In FIGS. 2a-2c operations of the memory device are illustrated in a timing diagram. For a single-bit read operation, FIG. 2a, the $\overline{W}$ signal stays high, the address is valid on terminals 18 during the intervals shown, and data is valid on the output terminal 23 during a period after the $\overline{RAS}$ and $\overline{CAS}$ signals drop. At other times, the output circuitry 24 holds the output terminal 23 in a high impedance state. A write operation is signaled by $\overline{W}$ going low and in this case the data on input terminal 22 must be valid during the period indicated; the data output terminal 23 stays in the high impedance state. The page mode operation of FIG. 2b is defined when $\overline{RAS}$ stays low and $\overline{CAS}$ is cycled to gate in a sequence of column addresses. Although shown for read, the page mode operation can be a write instead. The nibble mode, FIG. 2c, is like page mode but the column addresses are "don't care" after the first column address is latched onto the buffers 16. Also, $\overline{CAS}$ may be toggled faster for nibble mode (compared to page mode) because the 4-bits of data are already in the output circuitry 24 and need not be fetched.

Figure 3:
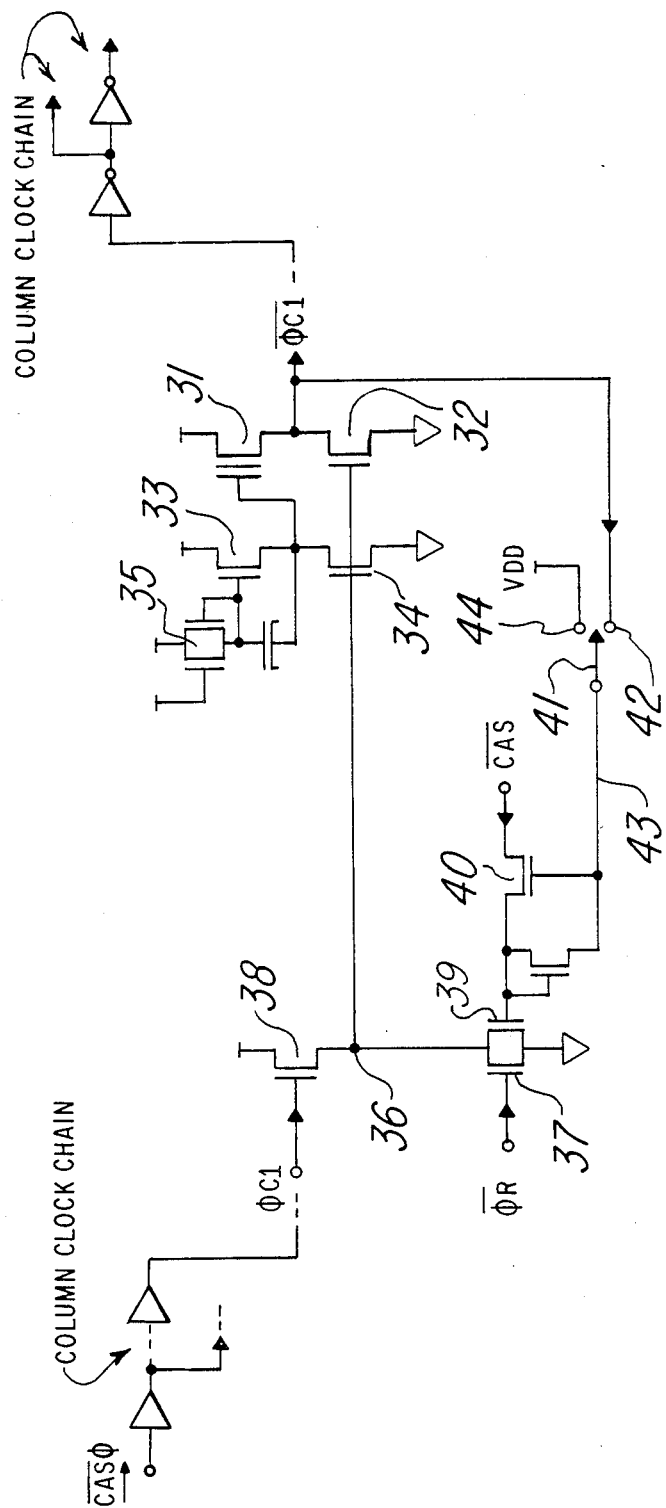
FIG. 3 is a detailed electrical diagram of the nibble-mode/page/mode selector circuitry used in the device of FIG. 1.

Referring to FIG. 3, a circuit in the column clock generator chain is shown wherein the metal-level selection is used according to the invention. This circuit receives a column clock $\phi C1$ which is derived from the $\overline{CAS}$ signal, and produces an output $\overline{\phi C1}$ which is used in the latches 16, the decoders 15 and 25, and the output circuitry 24 to initiate and propagate latching in the column address, decoding it, and using it to extract the data from the I/O lines from the sense amplifiers and presenting it to the circuitry 24 for output (in a read operation). That is, every time the $\overline{\phi C1}$ clock is cycled, a new column data output (or input) is processed for read (or write); when the $\overline{\phi C1}$ clock stays static, the existing data remains.

The circuit of FIG. 3 uses a push-pull output stage with pull-up transistor 31 and pull-down transistor 32, and an inverter with transistors 33 and 34 for driving the gate of the pull-up. A booting arrangement 35 assures that the gate of the transistor 31 is driven at a high level. An input node 36 is discharged by a $\overline{RAS}$-derived clock $\phi R$ and transistor 37, then after $\overline{CAS}$ drops $\phi C1$ goes high to drive node 36 high by transistor 38. But the node 36 is discharged every time $\overline{CAS}$ is toggled, through transistor 39 which is connected to $\overline{CAS}$ by transistor 40, if a switch 41 is in the position 44. This switch is the metal-level option. That is, the metal pattern connects the node 43 to either Vdd at point 44 or to the $\overline{\phi C1}$ feedback at point 42. With the switch in the $\overline{\phi C1}$ position 42, the device is programmed for nibble mode because the voltage $\phi C2$ on node 36 is not controlled by $\overline{CAS}$ after the first access. Thus, the column chain is disabled when in the nibble mode because when $\phi C2$ is high, $\overline{\phi C1}$ is low and transistor 40 is held off, decoupling $\overline{CAS}$ from the transistor 39. For page mode operation the switch 41 is in the Vdd position 44, which keeps $\phi C2$ (and thus output $\overline{\phi C1}$) under $\overline{CAS}$ control at all times; this allows the rest of the column chain to be activated on each $\overline{CAS}$ cycle.

While this invention has been described with reference to illustrative embodiments, this description is not intended to be construed in a limiting sense. Various modifications to the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A semiconductor dynamic read/write memory device manufactured to provide either page mode or nibble mode of operation, but not both, comprising:
   a memory array with rows and columns of cells,
   row addressing means for selecting a row of cells in response to a row address and a row address strobe signal,
   column addressing means for selecting a plurality of columns of cells in response to a column address and a column address strobe signal,
   data input/output means coupled to said column addressing means to input or output data selected among said plurality of columns,
   and selector means for selecting between page mode of operation and nibble mode of operation, said selector means including clock circuitry for coupling said column address strobe signal to said data input/output means,
   said selector means rendering a clock to be either responsive or non-responsive to toggling of said column address strobe signal,
   wherein said clock is rendered either responsive or non-responsive by a single conductor-level connection in manufacture.

2. A device according to claim 1 wherein said conductor-level connection is a metal-level connection which causes a node to either be discharged by said column address strobe signal, or unresponsive to said column address strobe signal.

3. A semiconductor memory device manufactured to provide either page mode or nibble mode of operation, but not both, comprising:
   a memory array with rows and columns of cells,
   row addressing means for selecting a row of cells in response to a row address and a row address strobe signal,
   column addressing means for selecting a plurality of columns of cells in response to a column address and a column address strobe signal,
   data output means coupled to said column addressing means to output data selected from said plurality of columns,
   and selector means for selecting between page mode of operation and nibble mode of operation, said selector means including clock circuitry for coupling said column address strobe signal to said data input/output means,
   said selector means rendering a clock to be either responsive or non-responsive to toggling of said column address strobe signal,
   wherein said clock is rendered responsive or non-responsive by a single conductor-level connection.

4. A device according to claim 3, wherein said conductor-level connection is a metal-level connection which causes a node to be either discharged by said column address strobe signal, or unresponsive to said column address strobe signal.

5. A memory device manufactured to provide either a first mode or second mode of operation, but not both, comprising:
   an array of cells,
   first addressing means for selecting cells in response to a first address and first control signal,
   second addressing means for selecting a plurality of cell outputs in response to a second address and a second control signal,
   data output means coupled to said second addressing means to output data selected among said plurality of cell outputs,
   and selector means for selecting between said first mode of operation and second mode of operation, said selector means including circuitry for coupling said second control signal to said data output means,
   said selector means rendering a clock to be either responsive or non-responsive to change of said second control,
   said clock being rendered either responsive or non-responsive by a single conductor-level connection.

6. A device according to claim 5 wherein said conductor-level connection is a metal-level connection which causes a node to be discharged by said second control signal, or unresponsive to said second control signal.

7. A semiconductor memory device manufactured to provide either page mode or nibble mode of operation, but not both modes of operation, said device comprising:
- a plurality of memory cells formed in an addressable array with row lines and column lines;
- a row decoder for selecting cells along a row line in response to a row address and a row address strobe signal;
- column address circuitry for selecting cells along a plurality of column lines in response to a column address and a column address strobe signal;
- data output circuitry coupled to said column address circuitry to output data from selected cells along the plurality of column lines; and
- selection circuitry, providing either page mode of operation or nibble mode of operation, including clock circuitry coupling said column address strobe signal to said data output circuitry,
- said selection circuitry rendering a clock either responsive or non-responsive to toggling of said column address strobe signal,
- wherein said clock is rendered either responsive or nonresponsive by a single conductor-level connection.

8. The device according to claim 7, wherein said conductor-level connection is a metal level connection which causes a node to either be discharged by said column address strobe signal or nonresponsive to said column address strobe signal.

9. A semiconductor memory device operable in the page mode or the nibble mode comprising:
- a plurality of memory cells formed in an addressable array with row lines and column lines;
- a row decoder for selecting cells along row lines in response to row address information and row address strobe signals; and
- column address circuitry for selecting cells along a plurality of column lines in response to column address information and column address strobe signals, said circuitry including a selection circuit for rendering said device operable in either the page mode or the nibble mode,
- said selection circuit comprising an input mode for effecting transfer of address signals into the column address circuitry in response to a series of column address strobe signals provided after each row address strobe signal,
- said input node chargeable according to a first clock signal derivable from the column address strobe signal, dischargeable according to a second clock signal derivable from the row address strobe signal and also dischargeable according to column address strobe signal,
- said input node operable to provide either the page mode or the nibble mode, said selection circuit including a first selectable connection for discharging said node in response to each in a series of address strobe signals; and a second selectable connection for rendering the column address circuitry nonresponsive to column address strobe signals after receiving a first signal in each series of column address strobe signals.

10. The semiconductor memory device of claim 9 wherein the second selectable connection renders the input node dischargeable according to the inverse value of the first clock signal.

11. The semiconductor memory device of claim 9 wherein selection between the page mode and the nibble mode of operation is effected by formation of either the first or second connection during manufacture of said device.

12. The semiconductor memory device of claim 9 wherein selection between page mode and nibble mode of operation is effected by forming one of the selectable connections with a single conductor-level option.

13. The semiconductor memory device of claim 12 wherein the single conductor-level option is only selectable during device manufacture.

14. The semiconductor memory device of claim 9 wherein the conductor level option is a metal-level interconnect.

15. The semiconductor memory device of claim 9 wherein operation is dedicated to either the page or nibble mode during manufacture by formation of either the first or second connection.

16. The semiconductor memory device of claim 9 wherein said selection circuit further comprises:
- a first transistor connected to provide a charging current to said input node in response to the first clock signal;
- a second transistor connected to discharge said input node in response to the second clock signal;
- a third transistor connectable to discharge said input node in response to column address strobe signals to effect the page mode of operation; and
- a fourth transistor having a first electrode connected to receive column address strobe signals, a second terminal connected to control current flow through the third transistor and a third terminal connected to effect either the page mode or the nibble mode of operation.

17. The semiconductor memory device of claim 16 further comprising an inverter having an input connected to said input node and wherein:
- the page mode of operation is effected by connection of the third terminal of the fourth transistor to a voltage level which renders the fourth transistor conductive; or
- the nibble mode of operation is effected by connection of the third terminal of the fourth transistor to an output signal of the inverter.

18. The semiconductor memory device of claim 17 wherein the inverter output provides a third clock signal which is substantially the inverse of the first clock signal.

19. The semiconductor memory device of claim 17 further comprising a fifth transistor having a first electrode connected to the third terminal of the fourth transistor and second and third terminals both connected to the second terminal of the third transistor.

20. The semiconductor memory device of claim 16 wherein all of the transistors are field effect transistors.

21. The semiconductor memory device of claim 16 wherein connection of the third terminal of the fourth transistor to select either the page mode or the nibble mode of operation is effected during manufacture of said memory device.

22. A circuit for selecting either the page or nibble mode of operation in a semiconductor memory device of the type formed with an array of addressable memory cells, a row decoder and a column decoder and a column clock chain, said circuit comprising:
- a charging transistor having a first terminal for receiving a voltage level, a second terminal for charging an input node and a third terminal for controlling charge of the input node according to a first clock signal, wherein the first clock signal is derivable from a column address strobe signal;

a second transistor connected to discharge the input node in response to a second clock signal;

a third transistor connectable to discharge the input node in response to column address strobe signals; and a fourth transistor having a first electrode connected to receive column address strobe signals, a second terminal connected to control discharge of the input node through the third transistor and a third terminal for selectively passing column address strobe signals to the third transistor wherein signals developed at the input node are coupled to control latching of column address signals and reading of data according to either the column mode or the page mode of operation.

23. The circuit of claim 22 wherein signals developed at the input node are coupled through an inverter to control the latching of column address signals and reading of data and wherein:

the page mode of operation is effected by connection of the third terminal of the fourth transistor to a voltage level which renders the fourth transistor conductive; or the nibble mode of operation is effected by connection of the third terminal of the fourth transistor to the output of the inverter.

24. The circuit of claim 23 wherein the inverter comprises:

a push-pull output stage having a pull-up field effect transistor in series with a pull-down field effect transistor and a node common to said output stage transistors, said common node providing the inverter output signal, said pull-down transistor having a gate electrode coupled to the input node;

a second push-pull inverter stage for driving the gate of the pull-up transistor in the output stage, said second stage including a second pull-up field effect transistor in series with a second pull-down field effect transistor and a second node common to said second transistors, said second pull-down transistor having a gate electrode coupled to the input node, said second common node coupled to the gate of the pull-up transistor in the output stage; and booting circuitry coupled to the second common node and coupled to the gate of the second pull-up transistor.

25. The circuit of claim 24 wherein signals generated by the inverter are substantially in phase with column address strobe signals.

26. A method for operating a semiconductor memory device, formed with an array of addressable memory cells, a row decoder and a column decoder, a column clock chain and a selection circuit coupled to provide signals along the column clock chain in accord with either the page mode or the nibble mode of operation, the method comprising the steps of:

switchably connecting an input node of the selection circuit to a reference potential in response to each in a series of signals derivable from row address strobe signals;

charging the input node with a first in a series of clock signals derivable from column address strobe signals;

providing a logic signal corresponding to the inverse of the signal developed at the input node to lathes; and maintaining the input node nonresponsive to subsequent clock signals in the series derivable from the column address strobe signals until the input node is again connected to the reference potential.

27. The method of claim 26 further comprising the step of again connecting the input node to the reference potential in response to a signal in the series derivable from row address strobe signals.

28. The method of claim 27 comprising the additional step of maintaining the input node disconnected from the reference potential between connections which are formed in response to the signals derivable from the row address strobe signals, said additional step providing the nibble mode of operation.

29. The method of claim 27, comprising the additional step of cyclically connecting the input node to the reference potential between connections which are formed in response to the signals derivable from the row address strobe signals, each cyclic connection effected by a signal in the series derivable from the column address strobe signals, said additional step providing the page mode of operation.

* * * * *